United States Patent [19]

Otani

[11] Patent Number: 4,606,027

[45] Date of Patent: Aug. 12, 1986

[54] ERROR CORRECTION APPARATUS USING A VITERBI DECODER

[75] Inventor: Susumu Otani, Tokyo, Japan

[73] Assignee: NEC Corporation, Tokyo, Japan

[21] Appl. No.: 659,533

[22] Filed: Oct. 10, 1984

[30] Foreign Application Priority Data

Oct. 12, 1983 [JP] Japan .............................. 58-190511

[51] Int. Cl.$^4$ ............................................ G06F 11/10
[52] U.S. Cl. ..................................................... 371/43
[58] Field of Search ............................. 371/43, 44, 45

[56] References Cited

U.S. PATENT DOCUMENTS

| | | | |
|---|---|---|---|
| 4,015,238 | 3/1977 | Davis | 371/43 |
| 4,240,156 | 12/1980 | Doland | 371/43 |
| 4,500,994 | 2/1985 | McCallister et al. | 371/43 |
| 4,536,878 | 8/1985 | Rattlingourd et al. | 371/43 |
| 4,545,054 | 10/1985 | Davis | 371/43 |

*Primary Examiner*—Charles E. Atkinson
*Attorney, Agent, or Firm*—Laff, Whitesel, Conte & Saret

[57] ABSTRACT

In an error correcting apparatus, an add-compare-select circuit is provided for each state in a given time slot of a Viterbi trellis diagram. The ACS circuit includes first and second pairs of adders coupled to a source of sequentially updated path metrics and to a branch metric generator which generates sums of branch metrics over successive time slots. The updated path metrics of states two time slots prior to the given time slot and the branch metric sums are added up in the adders. The outputs of adders in pairs are compared respectively by first comparators to determine the highest of the adder outputs. The determined highest values are passed through first selectors to a second comparator to further determine the highest of the selected adder outputs, the further determined value being passed through a second selector to the path metric source to update the previous value. Control signals indicating the determinations taken by the first and second comparators are coupled to a path memory for storing data indicating the paths of the selected values.

5 Claims, 6 Drawing Figures

PRIOR ART

FIG.4A

ERROR CORRECTION APPARATUS USING A VITERBI DECODER

BACKGROUND OF THE INVENTION

The present invention relates to an error correction apparatus for use in digital transmission systems, and in particular to a high-speed error correction apparatus for decoding received convolutional code bits using the Viterbi decoding algorithm.

Recent advances in digital techniques in telecommunication have brought about numerous proposals and new systems for correcting errors introduced in transmission facilities, particularly satellite communications. The Viterbi decoding algorithm has been employed in these proposed systems and highly evaluated because its practical utility. The Viterbi decoding algorithm involves iterative operations of sequential selection of one of two metric paths that remerge at a node in the decoder's trellis diagram by detecting the greater of accumulated metric values so that the selected path is taken as one having a maximum likelihood. Prior art error correction apparatus using the Viterbi decoding algorithm repeats the operations of add, compare and select on each time slot which corresponds to the period of a single bit or a single code word. However, the time taken to effect the add operation imposes limitations on the operating speed of the system, making it unsuitable for high speed data processing. With the current CMOS integrated circuit technology the maximum operating speed does not exceeds 10 Mb/sec.

SUMMARY OF THE INVENTION

An object of the present invention is to provide an error correction apparatus that eliminates the prior art problem by reducing the time involved with adding operations and to provide an error correction apparatus which is capable of handling high speed data.

The error correcting apparatus of the invention functions to decode transmitted convolutional code bits using the Viterbi decoding algorithm.

The error correcting apparatus comprises a path memory, a source of path metrics associated respectively with states of a Viterbi trellis diagram, the path metrics being updated sequentially in response to new path metrics and a branch metric calculator for sequentially generating a branch metric in response to input convolutional code data and providing a sum of the branch metrics associated with at least two successive branches entering each of the states of the trellis diagram.

The apparatus includes an add-compare-select (ACS) circuit that performs the addition, comparison and selection of quantized values representative of the degree of correlation between a code word associated with each of plural metric paths which remerge at a node, or state of the trellis diagram of the Viterbi decoding algorithm and the received code word. The ACS circuit comprises an adder circuit coupled to the source and to the branch metric calculator for adding the updated path metrics to a respective one of the branch metrics sums to provide second sums. The second sums are compared in a first comparator circuit to provide a plurality of first control signals each representing the highest of the second sums. A first selector circuit is coupled to the first comparator circuit for selecting the highest second sums in response to the first control signals. A second comparator circuit is coupled to the first selector circuit for comparing the selected second sums to provide a plurality of second control signals each representing the highest of the selected highest second sums. Further included is a second selector circuit which is coupled to the second comparator circuit to select the highest selected second sums in response to the second control signals and provides path metrics as the new path metrics to the source for updating previous path metrics. The outputs of the first and second comparators are further coupled to the path memory for storing data indicating the paths associated with the sums that are selected in response to the first and second control signals.

BRIEF DESCRIPTION OF THE DRAWINGS

The present invention will be described in further detail with reference to the accompanying drawings, in which.

DETAILED DESCRIPTION

Figure 1:
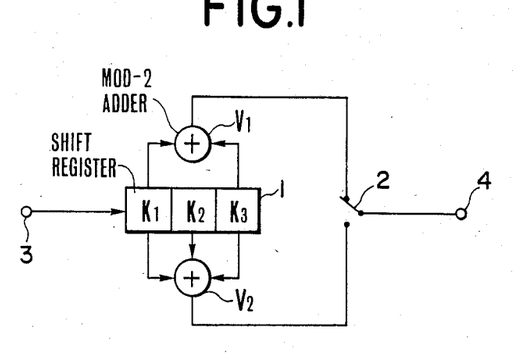
FIG. 1 is a circuit diagram of a convolutional encoder.

Before undertaking the detailed description, it is appropriate to describe a convolutional encoder having a constraint length $K=3$, an output code symbol $v=2$, and a coding rate $r=\frac{1}{2}$. In FIG. 1, the convolutional encoder comprises a three-stage shift register 1 having stages $K_1$, $K_2$ and $K_3$, two modulo-2 adders $v_1$ and $v_2$ and a commutator 2. A sequence of information bits is applied to terminal 3 and delivered as the code symbol output from terminal 4. The modulo-2 adder $v_1$ has two inputs which are connected to the $K_1$ and $K_3$ shift register stages and modulo-2 adder $v_2$ has three inputs connected to all the shift register stages. The outputs of modulo-2 adders are alternately coupled to the output terminal 4 by commutator 2.

Figure 2:
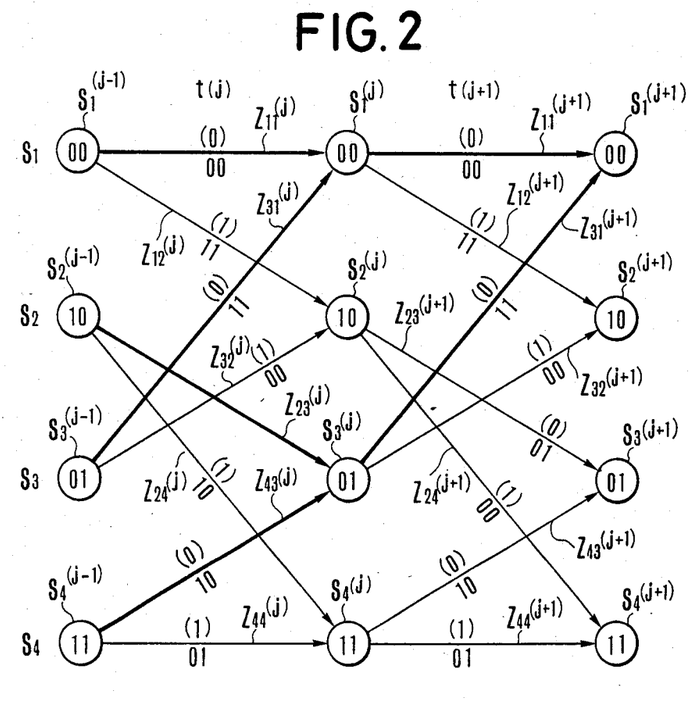
FIG. 2 is a trellis diagram useful for describing the operation of the present invention.

The state of the convolutional encoder is the contents of the first two shift register stages $K_1$ and $K_2$ which are given in nodes $S_i(j)$ at the end of a time slot $t(j)$ in the trellis diagram which is shown in FIG. 2 as a fixed periodic structure after trellis depth $K=3$ is reached. There are four possible states 00, 10, 01 and 11 and eight code paths (metric branches), two entering each state. The numerals given in parentheses on the metric paths indicate the information bits received in the associated time slot and those given under the metric paths indicate the output code symbols generated within that time slot.

The Viterbi decoder is a maximum likelihood decoder whose algorithm is to calculate the likelihood of each of the two paths entering a given state or node and eliminates from further consideration all but the most likely path that leads to that state. After each decoding operation only one path remains leading to each state. The decoder then proceeds one level deeper into the trellis and repeats the process, leaving four paths at each trellis depth, or time slot.

Figure 3:
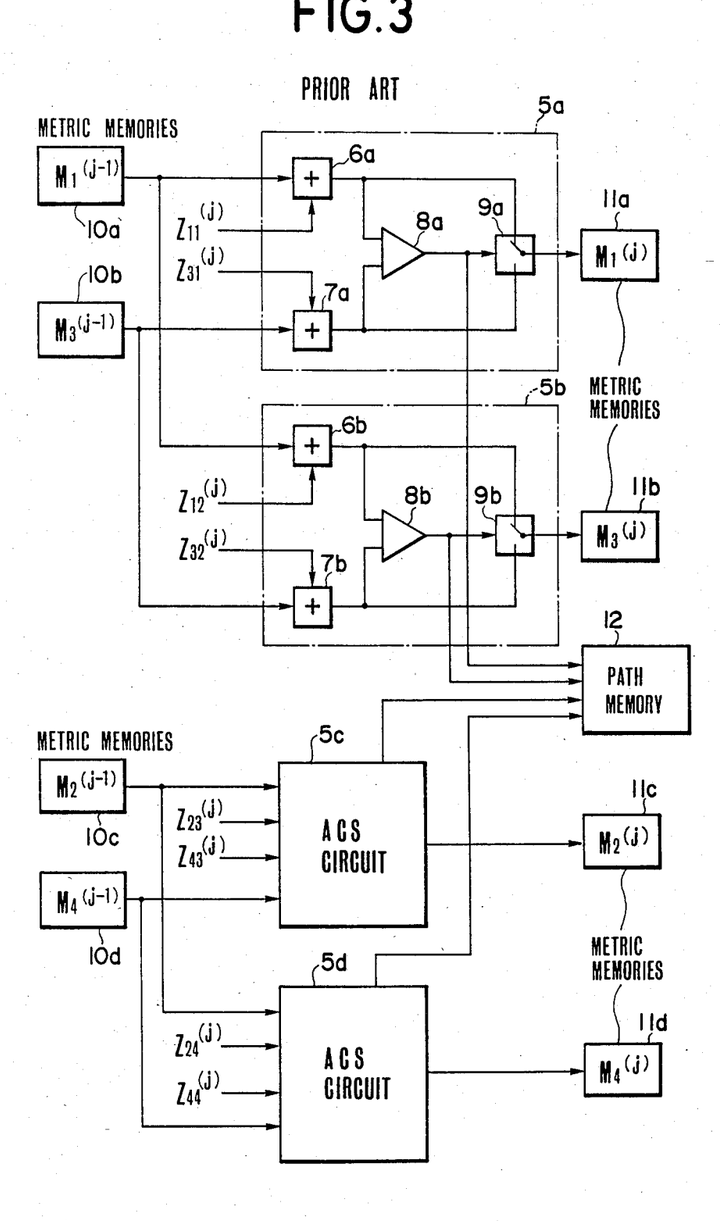
FIG. 3 is a block diagram of an embodiment of a prior art add-compare-select circuit.

An error correction apparatus incorporating the Viterbi decoding algorithm comprises a path metric detector that converts the received code word to a metric path metric $Z_i(j)$ such that code words 11, 01, 10 and 00 are converted to 2, 1, 1 and 0, respectively. Further included are a plurality of add-compare-select (ACS) circuits. FIG. 3 shows an embodiment of a prior art ACS circuit arrangement. In FIG. 3, the arrangement includes four ACS circuits 5a, 5b, 5c, 5d of identical construction. Each ACS circuit includes a pair of adders 6 and 7, a comparator 8 and a selector 9.

The adder 6a of ACS circuit 5a reads the previous path metric $M_1^{(j-1)}$ of node $S_1^{(j-1)}$ from memory 10a and adds it to the branch metric $Z_{11}^{(j)}$ of code word 00. The adder 7a reads the previous metric $M_3^{(j-1)}$ of node $S_3^{(j-1)}$ from memory 10b and adds it to the branch metric $Z_{31}^{(j)}$ of code word 11. Comparator 8a compares the combined output of adder 6a with the combined output of adder 7a and determines the highest of the two. A control signal indicating this determination is applied to selector 9a which selects the highest value as the maximum likelihood path and writes it into a metric memory 11a to update the previous value. The updated metric $M_1^{(j)}$ will be read in the next time slot as a path metric for node $S_1^{(j)}$. The control signal is also applied to a path memory 12 to store the paths that survive in the trellis diagram over the past until node $S_1^{(j)}$ is reached. Likewise, in ACS circuit 5b the path metric $M_1^{(j-1)}$ and the branch metric $Z_{12}^{(j)}$ of code word 11 are added up in adder 6b and the path metric $M_3^{(j-1)}$ and the branch metric $Z_{32}^{(j)}$ are added up in adder 7b. Comparator 8b determines the highest of these combined outputs as most likely and controls the selector 9b to pass it to a metric memory 11b for storage as a path metric $M_3^{(j)}$ for node $S_2^{(j)}$, updating the previous value. Similar ACS operations are performed by ACS circuits 5c and 5d simultaneously with the ACS operations performed by ACS circuits 5a and 5b. The path metric $M_2^{(j-1)}$ of node $S_2(j-1)$ is read from memory 10c, summed with the branch metric $Z_{23}^{(j)}$ of code word 01 and compared with the sum of the path metric $M_4^{(j-1)}$ of node $S_4^{(j-1)}$ read from memory 10d and the branch metric $Z_{43}^{(j)}$ of code word 10. The highest of the compared metrics is stored into memory 11c as a path metric $M_2^{(j)}$ of node $S_2^{(j)}$. The path metric $M_2^{(j-1)}$ of node $S_2(j-1)$ is read from memory 10c, summed with the branch metric $Z_{24}^{(j)}$ of code word 10 and compared with the sum of the path metric $M_4^{(j-1)}$ of node $S_4^{(j-1)}$ read from memory 10d and the branch metric $Z_{44}^{(j)}$ of code word 01. The highest of the compared metrics is stored into memory 11d as a path metric $M_4^{(j)}$ of node $S_4^{(j)}$. In this manner, sequential selection is repeated on each node, so that there remains only one path in the past time slot that occurred four to five times the constraint length K. Binary 1 or 0 generated corresponding to such surviving metric path forms the decoded signal. The prior art add-compare-select circuit is required to operate within a period $\tau$ which must not exceeds the time slot period and is given by:

$$\tau = \tau_m + \tau_a + \tau_c + \tau_s + \tau_w \quad (1)$$

where, $\tau_m$ is the time taken to read a path metric from metric memory, $\tau_a$, $\tau_c$, $\tau_s$ are the times involved in performing the addition, comparison and selection respectively, and $\tau_w$ the time taken to write path metric into metric memory. Thus, the bit rate attainable with the prior art ACS circuit is limited to $1/\tau$ bits/second. To achieve high speed decoding, it is necessary to reduce the addition operations since time $\tau_a$ accounts for a substantial part of the total operating time $\tau$.

Figure 4A:
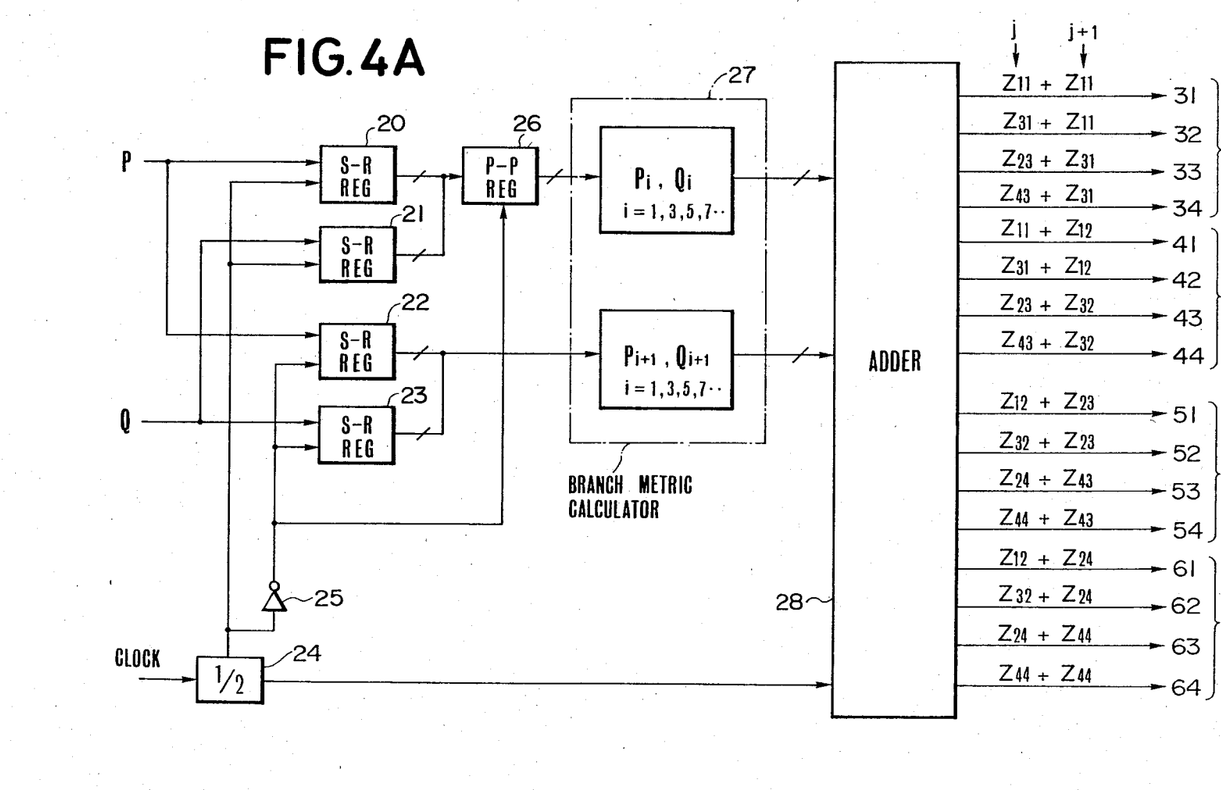
FIGS. 4A, 4B and 4C are block diagrams of an embodiment of the error correcting apparatus, with FIGS. 4B and 4C illustrating the add-compare-select circuit of the present invention.
Figure 4B:
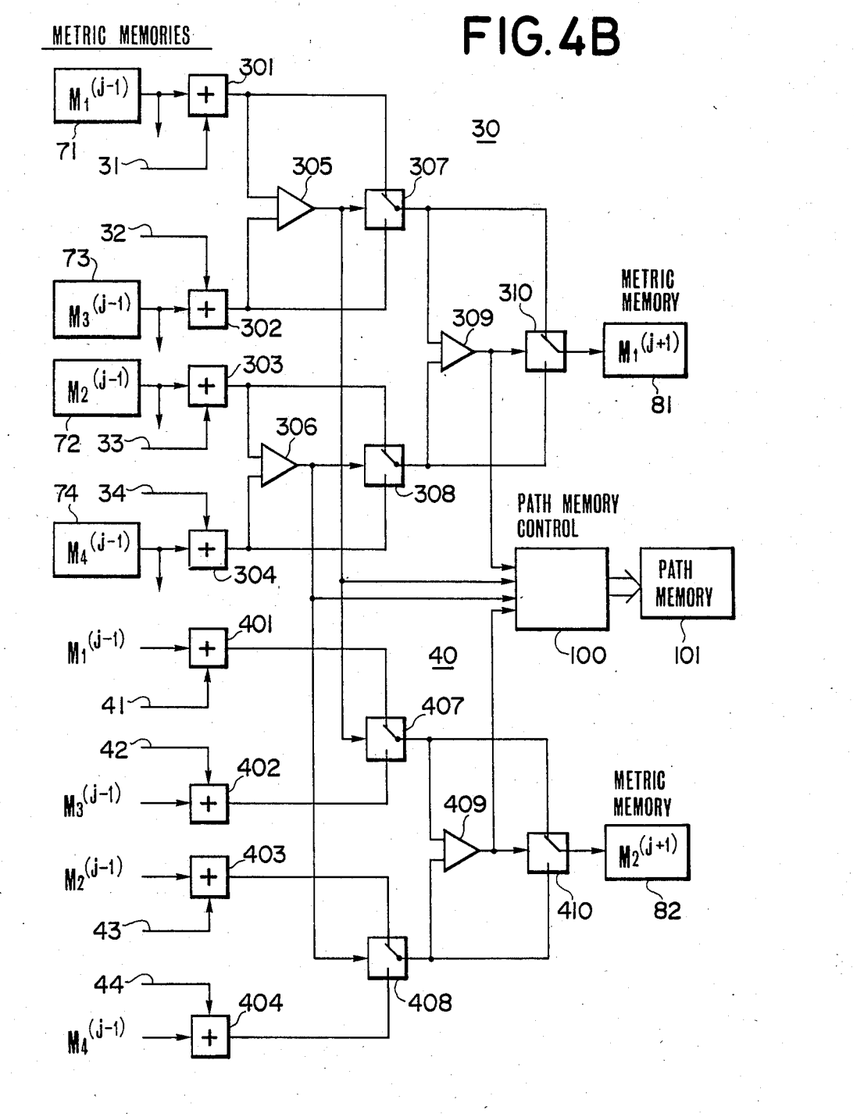
Figure 4C:
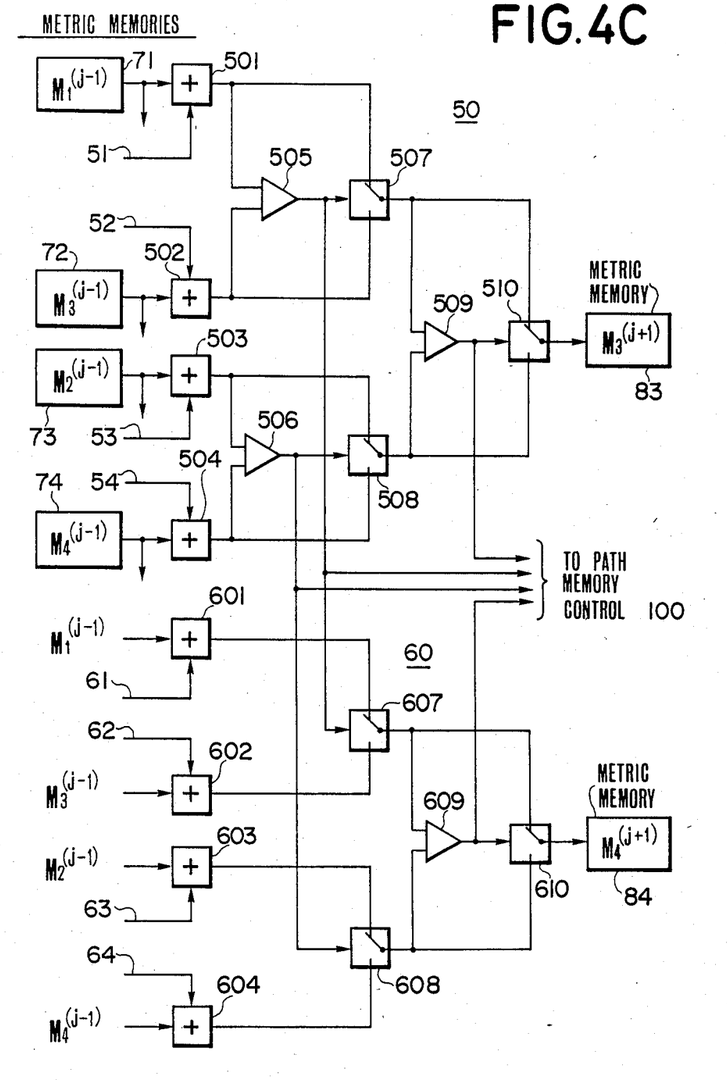

FIGS. 4A to 4C are block diagrams of an embodiment of the ACS circuit of the present invention. The add-compare-select circuit of the present invention reduces the decoding time by providing additions involved with two consecutive time slots in a single operation. For example, a new path mtric for node $S_1^{(j+1)}$, is derived from path metric sums derived from paths which remerge at nodes $S_1^{(j)}$ and $S_3^{(j)}$ and at node $S_1^{(j+1)}$ as indicated by thick lines in FIG. 2.

Specifically, in FIG. 4A, a received bit stream of convolutional code bits is transformed into sequences of code bits P and Q. The code bit P is applied to serial-parallel shift registers 20 and 22 and code bit Q to serial-parallel shift registers 21 and 23. Shift registers 20–23 are clocked by a frequency divider 24 at one half the system clock, with shift registers 22 and 23 being clocked through inverter 25 in opposite phase to shift registers 20 and 21. The parallel outputs of shift registers 20 and 21 are applied to parallel-parallel shift register 26 for proper timing with the parallel outputs of shift registers 22 and 23. A branch metric calculator 27 of any of conventional designs calculates the branch metric for odd-and even-numbered bits from the parallel data received from shift registers 26 and 23, the output of the branch metric calculator being applied to an adder 28. After 28 produces a plurality of groups of branch metric sums, each summing branch metrics of two sequential time slots $t(j)$ and $t(j+1)$. The first group consists of four branch metric sums $Z_{11}^{(j)}+Z_{11}^{(j+1)}$, $Z_{31}^{(j)}+Z_{11}^{(j+1)}$, $Z_{23}^{(j)}+Z_{31}^{(j+1)}$ and $Z_{43}^{(j)}+Z_{31}^{(j+1)}$. The second group consists of four branch metric sums $Z_{11}^{(j)}+Z_{12}^{(j+1)}$, $Z_{31}^{(j)}+Z_{12}^{(j+1)}$, $Z_{23}^{(j)}+Z_{32}^{(j+1)}$ and $Z_{43}^{(j)}+Z_{32}^{(j+1)}$. The third group consists of four branch metric sums $Z_{12}^{(j)}+Z_{23}^{(j+1)}$, $Z_{32}^{(j)}+Z_{23}^{(j+1)}$, $Z_{43}^{(j)}+Z_{43}^{(j+1)}$ and $Z_{44}^{(j)}+Z_{43}^{(j+1)}$, and the fourth group consists of four branch metric sums $Z_{12}^{(j)}+Z_{24}^{(j+1)}$, $Z_{32}^{(j)}+Z_{24}^{(j+1)}$, $Z_{24}^{(j)}+Z_{44}^{(j+1)}$ and $Z_{44}^{(j)}+Z_{44}^{(j+1)}$.

The branch metric sums are transmitted on conductors 31–34, 41–44, 51–54 and 61–64 to an add-compare-select circuit according to the present invention shown in FIGS. 4B and 4C. This ACS circuit generally comprises a pair of identical parts which are respectively shown in FIGS. 4B and 4C. The first part is subdivided into first and second ACS units generally shown at 30 and 40, respectively, in FIG. 4B. The first ACS unit 30 derives a path metric for node $S_1^{(j+1)}$ from path metrics of all the nodes in time slot $t(j-1)$, and the second ACS unit 40 derives a path metric for node $S_2^{(j+1)}$ from these $t(j-1)$th time-slot nodes. Likewise, the second part is subdivided into third and fourth ACS units generally shown at 50 and 60, respectively, in FIG. 4C. The third ACS unit 50 derives a path metric for node $S_3^{(j+1)}$ from path metrics of all the nodes in time slot $t(j-1)$, and the fourth ACS unit 60 derives a path metric for node $S_4^{(j+1)}$ from these $t(j-1)$th time-slot nodes.

The first ACS unit 30 comprises adders 301, 302, 303 and 304, first comparators 305 and 306, first selectors 307 and 308, second comparator 309 and a second selector 310. Adder 301 reads the path metric $M_1^{(j-1)}$ of node $S_1^{(j-1)}$ from metric memory 71 and sums it with branch metric sum $Z_{11}^{(j)}+Z_{11}^{(j+1)}$ developed on conductor 31. Adder 302 reads the path metric $M_3^{(j-1)}$ of node $S_3^{(j-1)}$ from metric memory 73 and sums it with branch metric sum $Z_{31}^{(j)}+Z_{11}^{(j+1)}$ developed on conductor 32. The outputs of adders 301 and 302 are compared by comparator 305 which determines the higherst of the two and generates a control signal indicating the path of the selected metric. The control signal from comparator 305 is applied to selector 307 to cause it to pass the highest metric sum to the second comparator 309.

Similarly, adder 303 reads the path metric $M_2^{(j-1)}$ of node $S_2^{(j-1)}$ from metric memory 72 and sums it with branch metric sum $Z_{23}^{(j)}+Z_{31}^{(j+1)}$ developed on conductor 33. Adder 304 reads the path metric $M_4^{(j-1)}$ of node $S_4^{(j-1)}$ from metric memory 74 and sums it with branch metric sum $Z_{43}^{(j)}+Z_{31}^{(j+1)}$ developed on conductor 34. The outputs of adders 303 and 304 are compared by comparator 306 which determines the highest of the two and generates a control signal indicating the path of the selected metric. The comparator 306 output is coupled to selector 308 to cause it to pass the higher metric sum as a second input to comparator 309.

The control signals from comparators 305 and 306 are further applied to a path memory control unit 100 to control the path memory 101 with respect to nodes $S_1^{(j)}$ and $S_3^{(j)}$.

The two highest metric sums are compared in comparator 309 and the highest of these sums is selected and passed through second selector 310 to a metric memory 81 of node $S_1^{(j+1)}$. Control signal from comparator 309 is delivered to a path memory 101 following the control signals from comparators 305, 306 to control path memory during time slot $t(j+1)$. While metric memories 71 and 81 are shown separately for purposes of explanation, these memories are implemented in a single memory cell so that the previous path metric $M_1^{(j-1)}$ is updated with the new path metric $M_1^{(j+1)}$ and this updated version will be read from the memory in the next decoding operation.

The second ACS unit 40 comprises adders 401, 402, 403 and 404, first selectors 407 and 408, comparator 409 and selector 410. Adder 401 reads the path metric $M_1^{(j-1)}$ from metric memory 71 and sums it with branch metric sum $Z_{11}^{(j)}+Z_{12}^{(j+1)}$ developed on conductor 41. Adder 402 reads the path metric $M_3^{(j-1)}$ from metric memory 73 and sums it with branch metric sum $Z_{31}^{(j)}+Z_{12}^{(j+1)}$ developed on conductor 42. It will be seen from the foregoing that the determination made by comparator 305 of the first ACS unit 30 can also be used to determine the highest of the outputs of adders 401 and 402. This advantageously eliminates the need for a comparator which would otherwise be coupled to the outputs of adders 401 and 402. Thus, the control signal from adder 305 is applied to selector 407 to pass the higher metric sum to comparator 409. In like manner, adder 403 reads the path metric $M_2^{(j-1)}$ from metric memory 72 and sums it with branch metric sum $Z_{23}^{(j)}+Z_{32}^{(j+1)}$ developed on conductor 43. Adder 404 reads the path metric $M_4^{(j-1)}$ from metric memory 74 and sums it with branch metric sum $Z_{43}^{(j)}+Z_{32}^{(j+1)}$ developed on conductor 44. Since the determination by comparator 306 can also be used to determine the highest of the outputs of adders 403 and 404, the output of comparator 306 is applied to selector 408. Comparator 409 functions in a manner similar to comparator 309 by determining the highest of the outputs of selectors 407 and 408, which is passed through selector 410 to a metric memory 82 which updates the previous path metric with the new path metric $M_2^{(j+1)}$. The control signal from comparator 409 is also applied to path memory control 100 to store the most likely path leading to node $S_2^{(j+1)}$.

The third ACS unit 50, shown in FIG. 4C, is identical in construction to the first ACS unit 30. The functions of adders 501 and 502 are similar to those of adders 301 and 302 with the exception that they receive path metric sums $Z_{12}^{(j)}+Z_{23}^{(j+1)}$ and $Z_{32}^{(j)}+Z_{23}^{(j+1)}$ developed respectively on conductors 51 and 52 and the functions of adders 503 and 504 are similar to those of adders 303 and 304 with the exception that they receive path metric sums $Z_{24}^{(j)}+Z_{43}^{(j+1)}$ and $Z_{44}^{(j)}+Z_{43}^{(j+1)}$ developed respectively on conductors 53 and 54. The highest metric sums are determined by comparators 505 and 506 as in the previous description and passed through selectors 507 and 508 to comparator 509. The highest metric sum determined by comparator 509 is a new path metric $M_3^{(j+1)}$ which is passed through selector 510 and stored into a metric memory 83, updating the previous path metric.

The control signals from comparators 505 and 506 are further applied to path memory control unit 100 to control the path memory 101 with respect to nodes $S_2^{(j)}$ and $S_4^{(j)}$.

The forth ACS unit 60 is identical to the second ACS unit 40. The functions of adders 601 and 602 are similar to those of adders 401 and 402 with the exception that they receive path metric sums $Z_{12}^{(j)}+Z_{24}^{(j+1)}$ and $Z_{32}^{(j)}+Z_{24}^{(j+1)}$ developed respectively on conductors 61 and 62 and the functions of adders 603 and 604 are similar to those of adders 403 and 404 with the exception that they receive path metric sums $Z_{24}^{(j)}+Z_{44}^{(j+1)}$ and $Z_{44}^{(j)}+Z_{44}^{(j+1)}$ developed respectively on conductors 63 and 64. Control signals indicating the determinations made by comparators 505 and 506 are applied to selectors 607 and 608 which pass the highest of the metric sums to comparator 609. The highest metric sum determined by comparator 609 is a new path metric $M_4^{(j+1)}$ which is passed through selector 610 and stored into a metric memory 84.

The time $\tau'$ required to complete the above described operations is given as follows:

$$\tau' = \tau_m + \tau_a + 2\tau_c + 2\tau_s + \tau_w \qquad (2)$$

The maximum bit rate $v'$ is thus given by $2/\tau'$ bits/sec. Assuming that a sum $\tau_m + \tau_a + \tau_w$ is greater than a sum $2(\tau_c + \tau_s)$, $v'$ is greater than 1.5 v. Thus, it is possible to increase the bit rate by more than 1.5 times as higher than the bit rate of the prior art circuit.

Summarizing the operation of the present invention, the error correcting apparatus comprises a source (71-74, 81-84) of path metrics associated respectively with states ($S_1$, $S_2$, $S_3$, $S_4$) in a given time slot $t(j-1)$ of a Viterbi trellis diagram, the path metrics ($M_i^{(j-1)}$, where i=1, 2, 3, 4) being updated sequentially in response to new path metrics, branch metric generating means (20-28) for sequentially generating a branch metric in response to input convolutional code data and providing sums of the branch metrics ($Z_{kl}^{(j)}+Z_{mn}^{(j+1)}$, where k, l, m, n=1, 2, 3, 4) on at least two successive branches entering each of the states (S1, S2, S3, S4 of a later time slot $t(j+1)$).

First adder means (301-304, 501-504) is coupled to the source and to the branch metric generating means for adding the updated path metrics to a respective one of the branch metric sums to provide a pair of second sums and second adder means (401-404, 601-604) is coupled to the source and the branch metric generating means for adding the updated path metrics to a respective one of the branch metric sums to provide a pair of third sums. The second and third sums have common branches entering an intermediate time-slot state of the trellis diagram and individual branches diverging from the intermediate time-slot state to the states of the later time slot. First comparing means (305, 306, 505, 506) is coupled to the first adder means for comparing the second sums of each pair to provide a plurality of first control signals each representing the highest of the compared second sums and the highest of the third sum. First selecting means (307, 308, 407, 408, 507, 508, 607, 608) is coupled to the first comparing means (305, 306, 505, 506) for selecting the highest second sums and selecting the highest third sums in response to the first control signals. Second comparing means (309, 409, 509, 609) is coupled to the first selecting means (307, 308, 407, 408, 507, 508, 607, 608) for comparing the selected second sums to provide a plurality of second control signals each representing the highest of the selected highest second sums and comparing the selected third sums to provide a plurality of third control signals each representing the highest of the selected highest third sums. Further provided is a second selecting means (310, 410, 510, 610) coupled to the second comparing means (309, 409, 509, 609) for selecting the highest selected second sums in response to the second control signals for generating first new path metrics and selecting the highest selected third sums in response to the third control signals for generating second new path metrics, the first and second new path metrics being applied to the source for updating previous path metrics. Storage means (100, 101) is coupled to the first and second comparing means for storing data indicating the paths associated with the sums selected in response to the first, second and third control signals.

It will be seen from the foregoing that the maximum bit rate can be further increased by simultaneously processing the metrics on three or more consecutive time slots.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. An error correcting apparatus comprising:
    a source of path metrics associated respectively with states in a given time slot of a Viterbi trellis diagram, said path metrics being updated sequentially in response to new path metrics;
    branch metric generating means for sequentially generating a branch metric in response to input convolutional code data and providing a plurality of sums of the branch metrics over successive branches diverging from said given time-slot states to later time-slot states;
    adder means coupled to said source and to said branch metric generating means for adding the updated path metrics to a respective one of the branch metric sums to provide a plurality of second sums;
    comparing means coupled to said adder means for comparing said second sums and detecting the highest of the compared second sums to provide a control signal representing the highest of the compared second sums;
    selecting means coupled to said comparing means for selecting the detected highest second sum in response to said control signal for providing a new path metric to said source for updating a previous path metric; and
    storage means coupled to said comparing means for storing data indicating the path associated with the selected highest second sum.

2. An error correcting apparatus comprising:
    a source of path metrics associated respectively with states in a given time slot of a Viterbi trellis diagram, said path metrics being updated sequentially in response to new path metrics;
    branch metric generating means for sequentially generating a branch metric in response to input convolutional code data and providing a plurality of sums of the branch metrics over successive branches diverging from said given time-slot states to later time-slot states;
    adder means coupled to said source and to said branch metric generating means for adding the updated path metrics to a respective one of the branch metric sums to provide second sums;
    first comparing means coupled to said adder means for comparing said second sums to provide a plurality of first control signals each representing the highest of the second sums;
    first selecting means coupled to said first comparing means for selecting said highest second sums in response to said first control signals;
    second comparing means coupled to said first selecting means for comparing the selected second sums to provide a plurality of second control signals each representing the highest of the selected highest second sums;
    second selecting means coupled to said second comparing means for selecting said highest selected second sums in response to said second control signals for providing path metrics to said source for updating previous path metrics; and
    storage means coupled to said first and second comparing means for storing data indicating the paths associated with the sums selected in response to said first and second control signals.

3. An error correcting apparatus as claimed in claim 2, wherein said adder means comprises first and second pairs of adders and third and fourth pairs of adders, the adders of each pair being associated respectively with the states of said given time slot, said first, second, third and fourth pairs being associated respectively with the states of a later time slot, the adders of each pair adding the updated path metrics of the associated given time-slot states to the branch metric sums associated respectively with different branches diverging from said given time-slot states to the one of the later time-slot states with which said each pair is associated.

4. An error correcting apparatus as claimed in claim 3, wherein the branches associated with the adders of said first and second pairs share a common state of the Viterbi trellis diagram in an intermediate time slot with the branches associated with the adders of said third and fourth pairs.

5. An error correcting apparatus as claimed in claim 4, wherein said first comparing means comprises:
    a pair of first and second comparators respectively connected to the outputs of the adders of said first and second pairs for generating first and second comparator outputs as said first control signals, said first selecting means comprising:
    first and second pairs of selectors, the selectors of the first pair being connected respectively to the outputs of the adders of said first and second pairs and being respectively responsive to said first and second comparator outputs to selectively apply the last-mentioned outputs to said second comparing means, the selectors of the second pair being connected respectively to the outputs of the adders of said third and fourth pairs and being respectively responsive to said first and second comparator outputs to selectively apply the last-mentioned outputs to said second comparing means.

* * * * *